(12) United States Patent
Tseng et al.

(10) Patent No.: US 11,908,796 B2
(45) Date of Patent: Feb. 20, 2024

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Chih-Yu Tseng, Hsinchu County (TW); Wei-Lun Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 17/460,336

(22) Filed: Aug. 30, 2021

(65) Prior Publication Data

US 2023/0065711 A1 Mar. 2, 2023

(51) Int. Cl.
*H01L 23/528* (2006.01)
*H01L 21/768* (2006.01)

(52) U.S. Cl.
CPC ........ *H01L 23/528* (2013.01); *H01L 21/7684* (2013.01); *H01L 21/76819* (2013.01); *H01L 21/76837* (2013.01); *H01L 21/76885* (2013.01)

(58) Field of Classification Search
CPC . H01L 23/528; H01L 23/5283; H01L 23/522; H01L 21/76819; H01L 21/76837; H01L 21/7684; H01L 21/76885
See application file for complete search history.

(56) References Cited

U.S. PATENT DOCUMENTS

2001/0042921 A1* 11/2001 Mori ................. H01L 21/76877
438/622
2011/0089569 A1* 4/2011 Asakawa ............... H01L 23/522
257/773

* cited by examiner

*Primary Examiner* — Thanhha S Pham
(74) *Attorney, Agent, or Firm* — JCIPRNET

(57) ABSTRACT

A semiconductor device includes a substrate, a first metal layer, a dielectric layer, and a second metal layer. The substrate includes a dense region and an isolation region. The first metal layer is disposed over the substrate and includes a first metal pattern and a second metal pattern. The first metal pattern is located in the dense region. There is at least one slot in the first metal pattern. The second metal pattern is located in the isolation region. The dielectric layer is disposed on the first metal layer. The second metal layer is disposed on the dielectric layer.

20 Claims, 15 Drawing Sheets

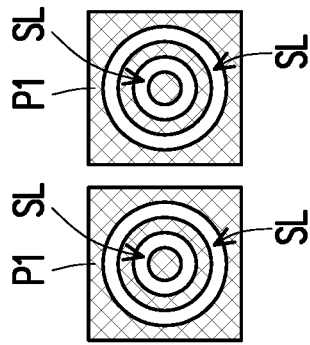
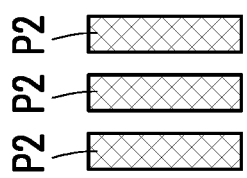
FIG. 2C
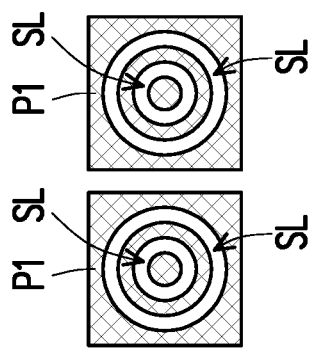
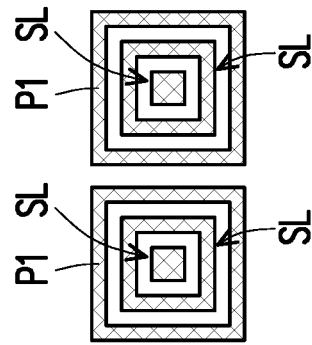
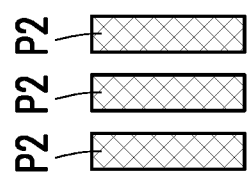
FIG. 2D
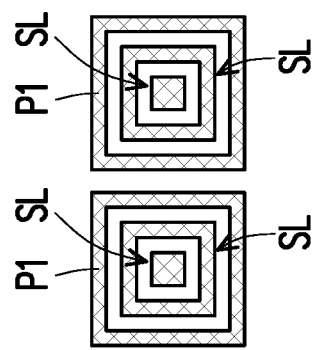

SEMICONDUCTOR DEVICE AND METHOD OF FABRICATING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B to FIG. 2H are top views of the metal layer in FIG. 1B in accordance with alternative embodiments of the disclosure.

DETAILED DESCRIPTION

Figure 1A:
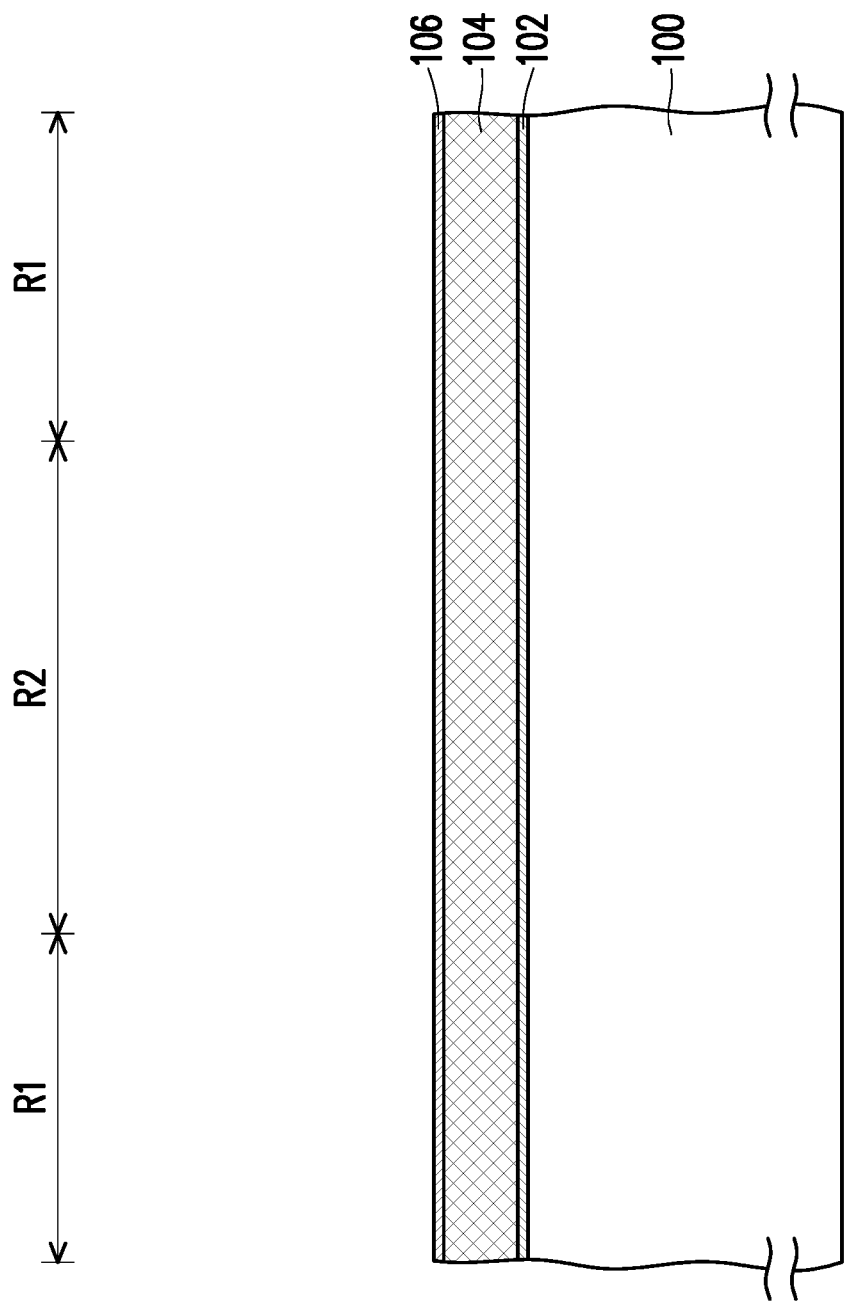
FIG. 1A to FIG. 1K are cross-sectional views illustrating various stages of a method of fabricating a semiconductor device in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a cross-sectional view illustrating one stage of a method of fabricating a semiconductor device 10 in accordance with some embodiments of the disclosure. Referring to FIG. 1A, a substrate 100 is provided. The substrate 100 may include a dense region R1 and an isolation region R2. The pattern density of the dense region R1 may be greater than the pattern density of the dense region R2. The pattern density of the dense region R1 refers to the ratio of the top view area of the pattern in the dense region R1 to the top view area of the dense region R1. The pattern density of the isolation region R2 refers to the ratio of the top view area of the pattern in the isolation region R2 to the top view area of the isolation region R2. In some embodiments, the dense region R1 may be located at the die edge, and the isolation region R2 may be located at die center, but the disclosure is not limited thereto. In some alternative embodiments, the dense region R1 may be located at the die center, and the isolation region R2 may be located at die edge. In some embodiments, the semiconductor device 10 may be a liquid crystal on silicon (LCOS) device, the dense region R1 may be a periphery region, and the isolation region R2 may be a pixel region.

The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be an integrated circuit die, such as a logic die, a memory die, an application specific integrated circuit (ASIC) die, or the like. The substrate 100 may be a complementary metal oxide semiconductor (CMOS) die and may be referred to as a CMOS under array (CUA). The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, circuits (not shown) may be formed over the substrate 100. The circuits include transistors and interconnect structure. The transistors may be located at a top surface of the substrate 100. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes. The interconnect structure includes one or more stacked dielectric layers and conductive features formed in the one or more dielectric layers, for example. The interconnect structure may be electrically connected to the transistors to form functional circuits. In some embodiments, the functional circuits formed by the interconnect structure may include logic circuits, memory circuits, sense amplifiers, controllers, input/output circuits, image sensor circuits, the like, or combinations thereof. Although the transistors formed over the substrate are discussed, other active devices (e.g., diodes or the like) and/or passive devices (e.g., capacitors, resistors, or the like) may also be formed as part of the functional circuits.

A barrier material layer 102 may be formed over the substrate 100. The material of the barrier material layer 102 may include tantalum (Ta), tantalum nitride (TaN), titanium (Ti), titanium nitride (TiN), or combinations thereof. The barrier material layer 102 may be formed by, for example, physical vapor deposition (PVD) or atomic layer deposition (ALD). It should be noted that the barrier material layer 102 illustrated in FIG. 1A may be omitted in some alternative embodiments.

A metal material layer 104 may be formed over the substrate 100. For example, the metal material layer 104 may be formed on the barrier material layer 102. The metal material layer 104 may be a single-layered structure or a multi-layered structure. The material of metal material layer 104 may include a conductive metal material, such as aluminum (Al), aluminum alloy (e.g., aluminum copper alloy (AlCu)), copper (Cu), copper alloy, Ti, Ta, tungsten (W), or combinations thereof. In some embodiments, the material of metal material layer 104 may be AlCu. The metal material layer 104 may be formed by, for example, PVD, chemical vapor deposition (CVD), or atomic layer deposition (ALD).

A barrier material layer 106 may be formed on the metal material layer 104. The material of the barrier material layer 106 may include Ta, TaN, Ti, TiN, or combinations thereof. The barrier material layer 106 may be formed by, for example, PVD or ALD. It should be noted that the barrier material layer 106 illustrated in FIG. 1A may be omitted in some alternative embodiments.

Figure 1B:
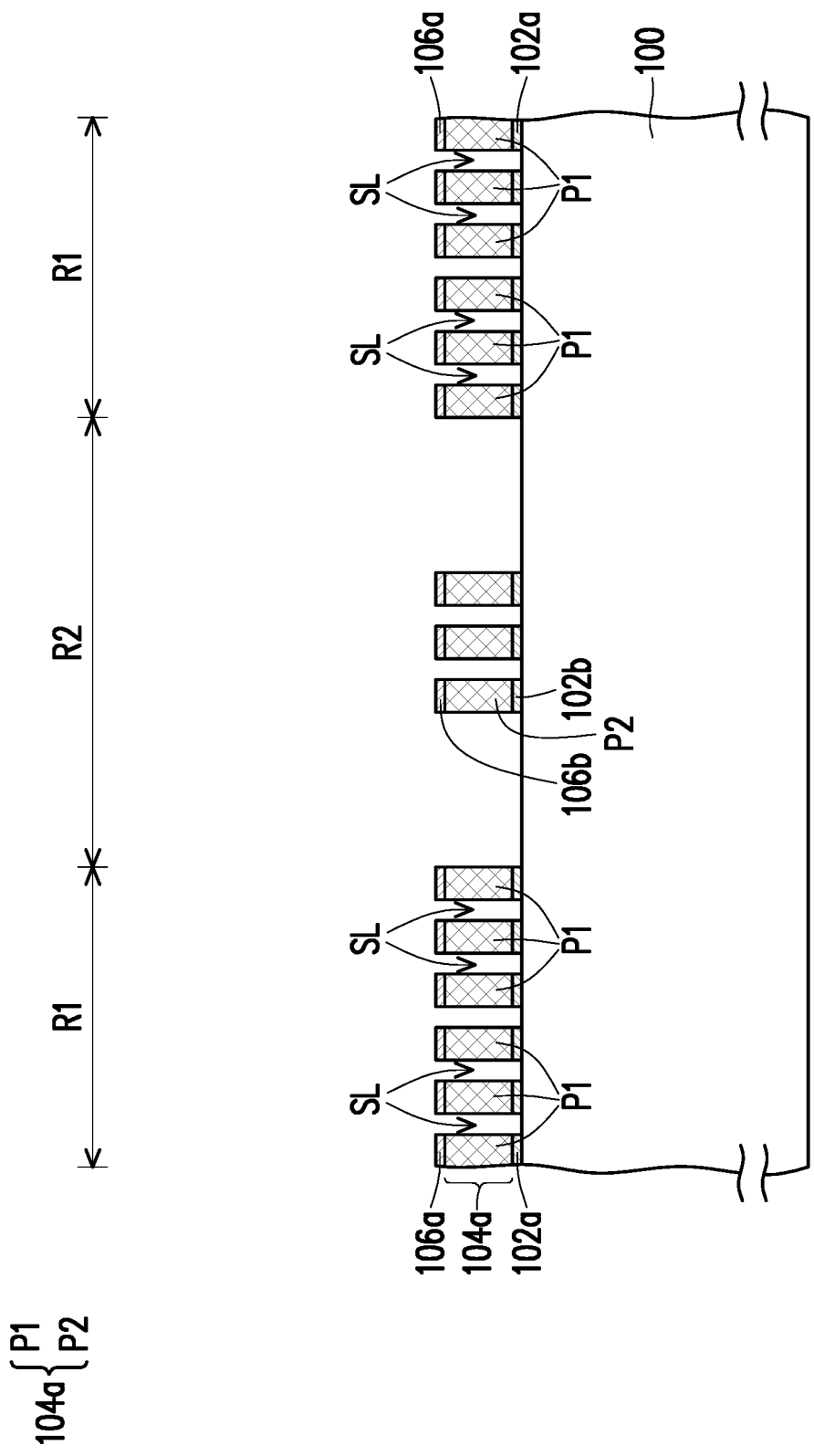
Figure 2A:
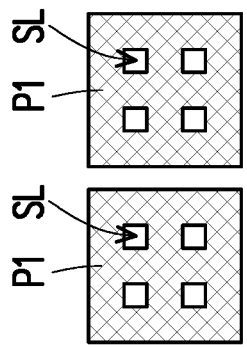
FIG. 2A is a top view of the metal layer in FIG. 1B.
Figure 2A:
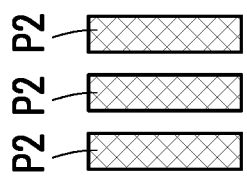
Figure 2A:
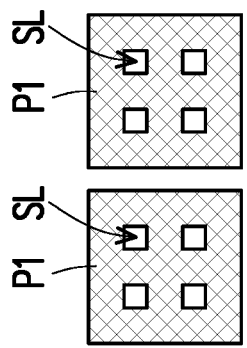
Figure 2B:
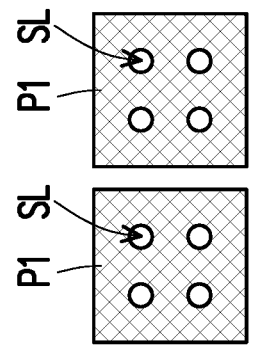
Figure 2B:
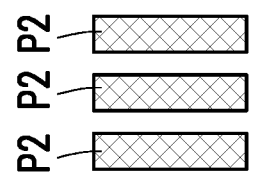
Figure 2E:
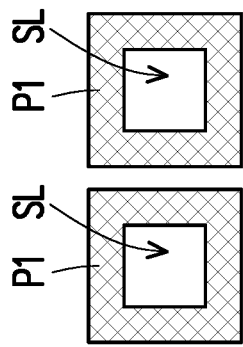
Figure 2E:
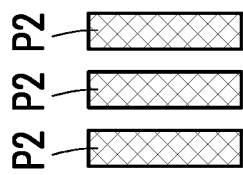
Figure 2E:
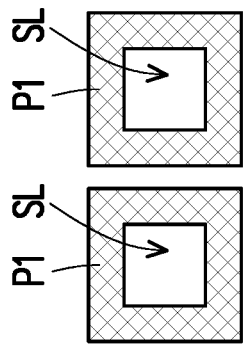
Figure 2F:
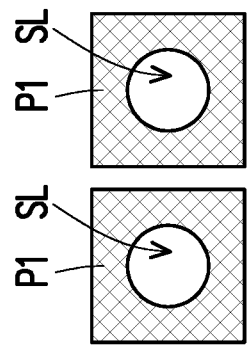
Figure 2F:
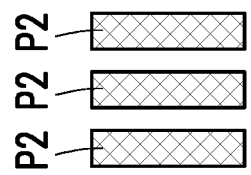
Figure 2F:
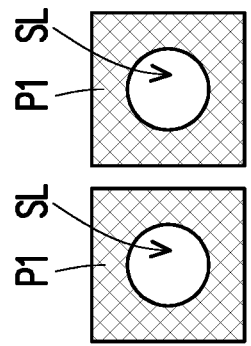
Figure 2G:
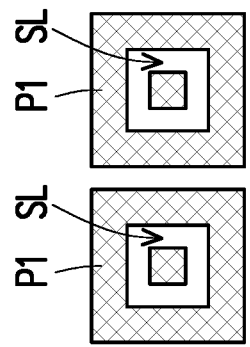
Figure 2G:
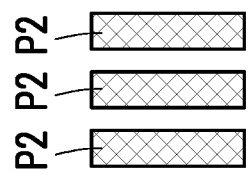
Figure 2G:
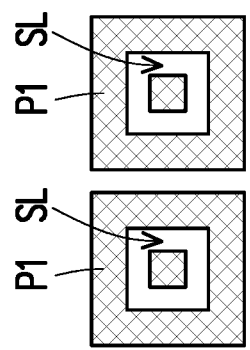
Figure 2H:
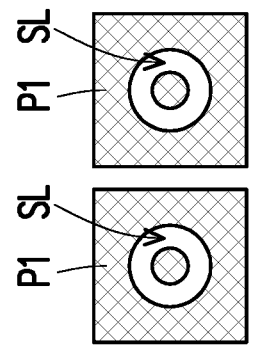
Figure 2H:
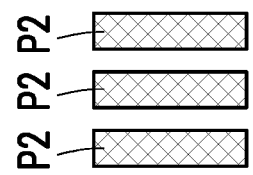

FIG. 1B is a cross-sectional view illustrating one stage of the method of fabricating the semiconductor device 10 in accordance with some embodiments of the disclosure. FIG. 2A is a top view of the metal layer in FIG. 1B. FIG. 2B to FIG. 2H are top views of the metal layer in FIG. 1B in accordance with alternative embodiments of the disclosure. Referring to FIG. 1B, the barrier material layer 106, the metal material layer 104, and the barrier material layer 102 may be patterned to form a barrier layer 106a, a barrier layer 106b, a metal layer 104a, a barrier layer 102a, and a barrier layer 102b over the substrate 100. For example, the barrier material layer 106, the metal material layer 104, and the barrier material layer 102 may be patterned by performing lithography process and etch process.

Referring to FIG. 1B and FIG. 2A, the metal layer 104a is disposed over the substrate 100. In some embodiments, the metal layer 104a may be a top metal layer. The metal layer 104a includes a metal pattern P1 and a metal pattern P2. The metal pattern P1 is located in the dense region R1. There is at least one slot SL in the metal pattern P1, thereby reducing the pattern density of the metal pattern P1 in the dense region R1. The slot SL may penetrate through the metal pattern P1. The metal pattern P2 is located in the isolation region R2. The metal pattern P1 and the metal pattern P2 may be separated from each other. In some embodiments, the metal layer 104a may include a plurality of metal patterns P1 and a plurality of metal patterns P2. The metal patterns P1 may be separated from each other. The metal patterns P2 may be separated from each other. Each metal pattern P1 may be electrically connected to the corresponding active device (e.g., a transistor) (not shown) located on the substrate 100 by the interconnect structure (not shown), and each metal pattern P2 may be electrically connected to the corresponding active device (e.g., a transistor) (not shown) located on the substrate 100 by the interconnect structure (not shown). The pattern density of the metal pattern P1 in the dense region R1 may be greater than the pattern density of the metal pattern P2 in the isolation region R2. For example, the pattern density of the metal pattern P1 in the dense region R1 may be greater than the pattern density of the metal pattern P2 in the isolation region R2 by 20%, 25%, 30%, 35%, 40% or more. When the difference between the pattern density of the metal pattern P1 in the dense region R1 and the pattern density of the metal pattern P2 in the isolation region R2 is greater, the subsequently formed dielectric layer 108 (FIG. 1C) may suffer the non-uniformity issue. Moreover, the barrier layer 102a may be dispose between the metal pattern P1 and the substrate 100. The barrier layer 102b may be dispose between the metal pattern P2 and the substrate 100. The barrier layer 106a may be disposed on the metal pattern P1. The barrier layer 106b may be disposed on the metal pattern P2.

In some embodiments, there is a plurality of slots SL in one metal pattern P1, and the slots SL may be separated from each other (see FIG. 2A to FIG. 2D). In some alternative embodiments, there is only one slot SL in one metal pattern P1 (see FIG. 2E to FIG. 2H). Furthermore, the top view shape of the slot SL may be any shape. For example, the top view shape of the slot SL may be a rectangular shape (see FIG. 2A and FIG. 2E), a circular shape (see FIG. 2B and FIG. 2F), a ring-shape (see FIG. 2C, FIG. 2D, FIG. 2G, and FIG. 2H), or combinations thereof.

Figure 1C:
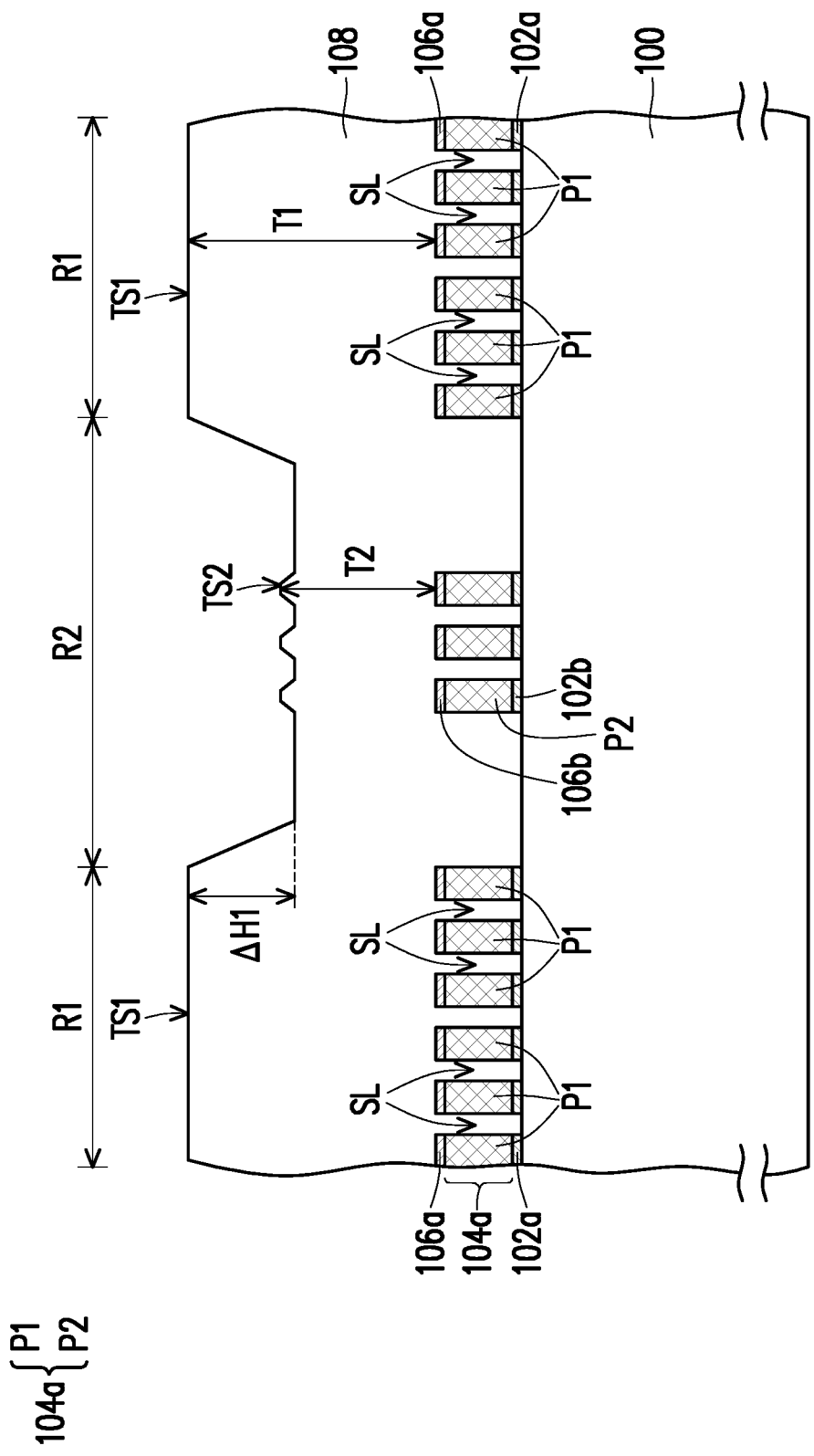

FIG. 1C is a cross-sectional view illustrating one stage of the method of fabricating the semiconductor device 10 in accordance with some embodiments of the disclosure. Referring to FIG. 1C, a dielectric layer 108 is formed on the metal layer 104a. That is, the dielectric layer 108 is disposed on the metal layer 104a. In some embodiments, the dielectric layer 108 may cover the barrier layer 106a, the barrier layer 106b, the metal layer 104a, the barrier layer 102a, and the barrier layer 102b. The slot SL may be filled with the dielectric layer 108. The thickness T1 of the dielectric layer 108 on the metal pattern P1 may be greater than the thickness T2 of the dielectric layer 108 on the second metal pattern P2. The dielectric layer 108 may have has a top surface TS1 in the dense region R1 and a top surface TS2 in the isolation region R2. The top surface TS1 may be higher than the top surface TS2. The material of the dielectric layer 108 may include silicon oxide (SiO), silicon nitride (SiN), silicon oxynitride (SiON), phosphosilicate glass (PSG), borophosphosilicate glass (BPSG), spin-on glass (SOG), fluorinated silica glass (FSG), carbon doped silicon oxide (e.g., SiCOH), polyimide, and/or combinations thereof. In some alternative embodiments, the material of the dielectric layer 108 may include low-k dielectric materials. It is understood that the material of the dielectric layer 108 may include one or more dielectric materials and/or one or more dielectric layers. In some embodiments, the dielectric layer 108 is formed to a suitable thickness by high density plasma chemical vapor deposition (HDPCVD), flowable chemical vapor deposition (FCVD), thermal CVD, sub atmospheric chemical vapor deposition (SACVD), spin-on, sputtering, or other suitable methods.

Furthermore, since the slot SL in the metal pattern P1 can reduce the pattern density of the metal pattern P1 in the dense region R1, the maximum height difference ΔH1 between the dielectric layer 108 in the dense region R1 and the dielectric layer 108 in the isolation region R2 can be reduced, and the dielectric layer 108 can have better uniformity without extra photomask and extra process.

Figure 1D:
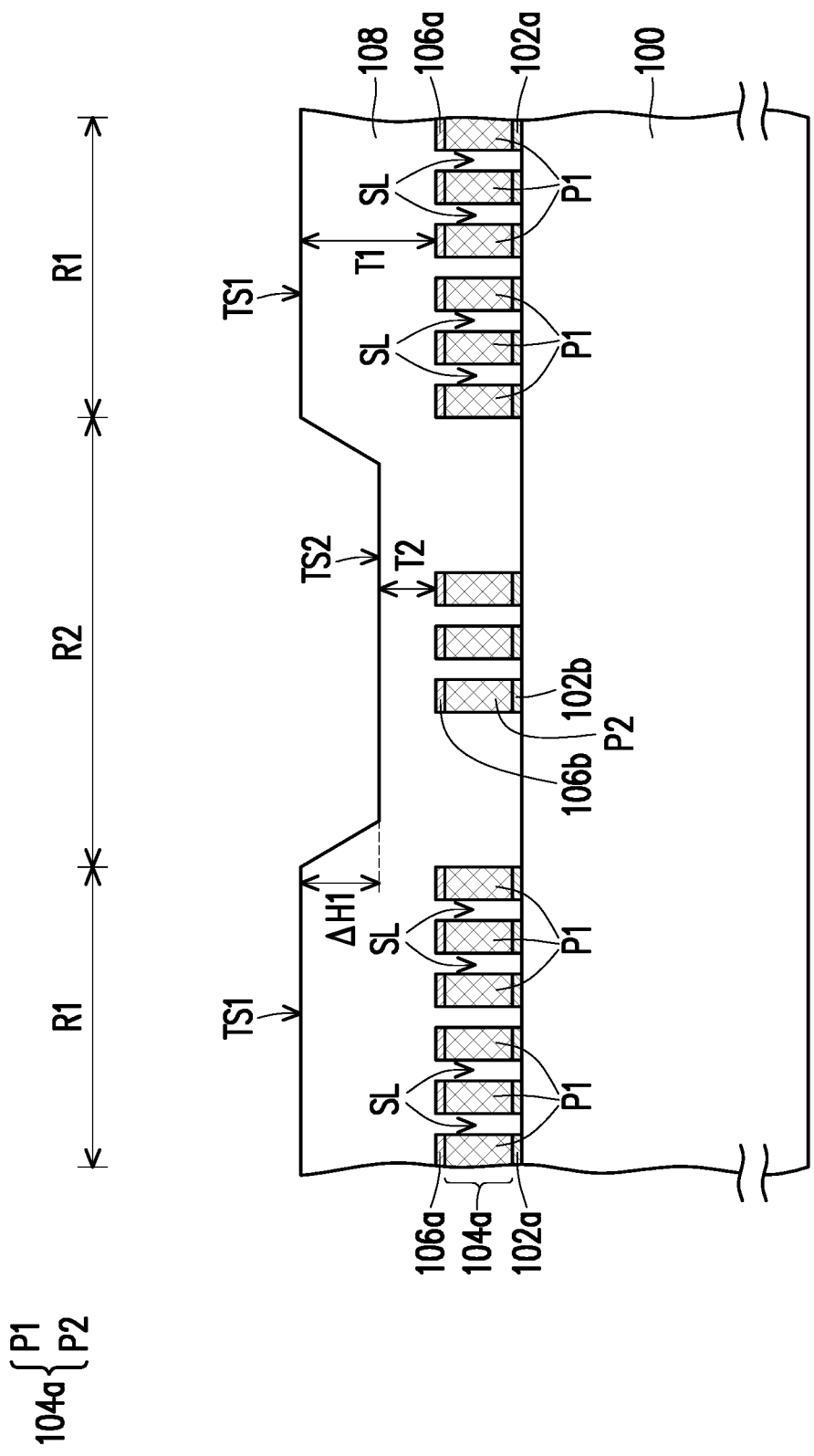

FIG. 1D is a cross-sectional view illustrating one stage of the method of fabricating the semiconductor device 10 in accordance with some embodiments of the disclosure. Referring to FIG. 1D, a chemical mechanical polishing (CMP) process may be performed on the dielectric layer 108. Thereby, the maximum height difference ΔH1 between the dielectric layer 108 in the dense region R1 and the dielectric layer 108 in the isolation region R2 can be further reduced. After the CMP process is performed on the dielectric layer 108, the top surface TS1 of the dielectric layer 108 may be higher than the top surface TS2 of the dielectric layer 108, and the thickness T1 of the dielectric layer 108 on the metal pattern P1 may be greater than the thickness T2 of the dielectric layer 108 on the second metal pattern P2.

Figure 1E:
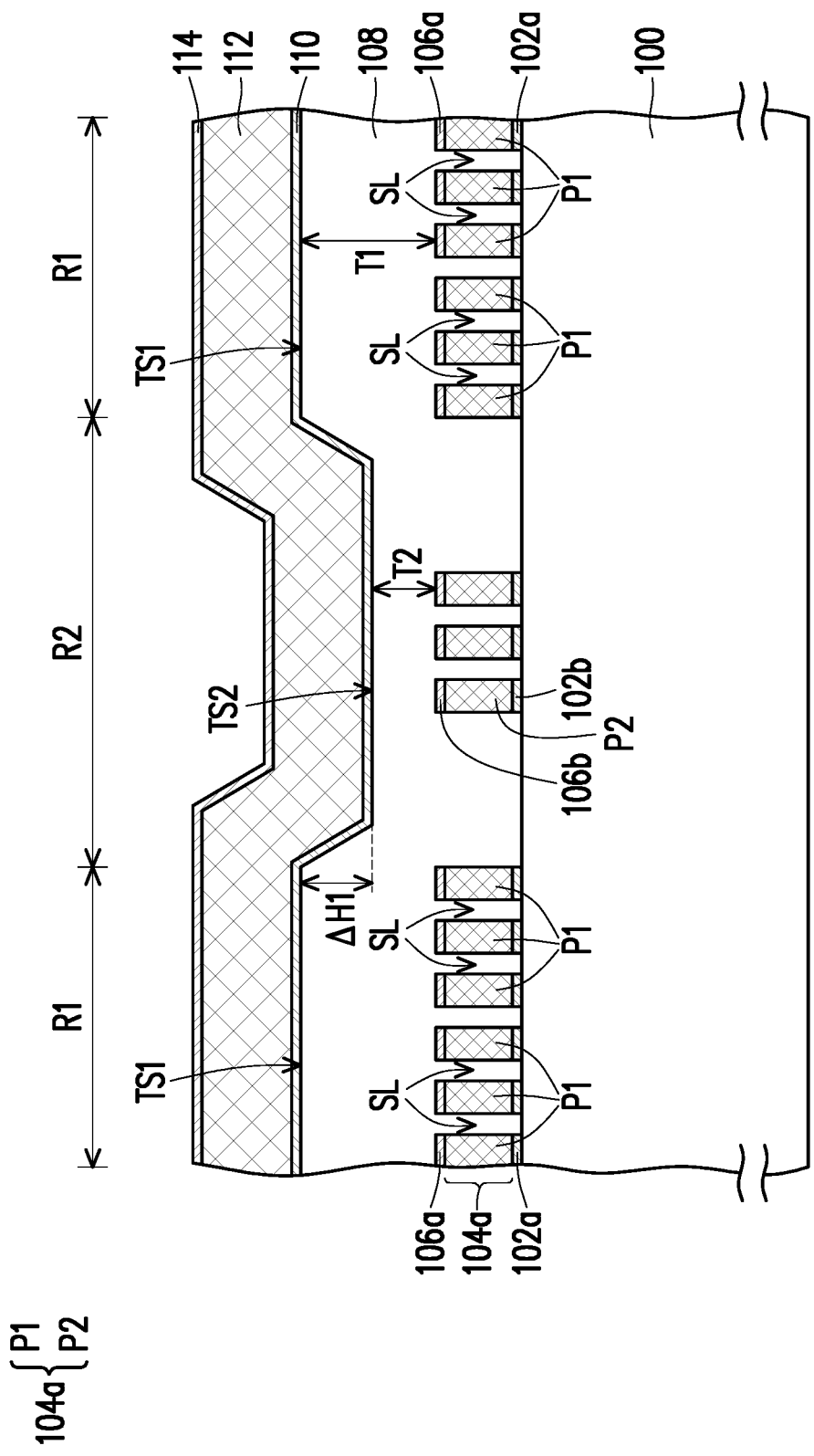

FIG. 1E is a cross-sectional view illustrating one stage of the method of fabricating the semiconductor device 10 in accordance with some embodiments of the disclosure. Referring to FIG. 1E, a barrier material layer 110 may be formed on the dielectric layer 108. The material of the barrier material layer 110 may include Ta, TaN, Ti, TiN, or combinations thereof. The barrier material layer 110 may be formed by, for example, PVD or ALD. It should be noted that the barrier material layer 110 illustrated in FIG. 1E may be omitted in some alternative embodiments.

A metal material layer 112 may be formed on the dielectric layer 108. For example, the metal material layer 112 may be formed on the barrier material layer 110. The metal material layer 112 may be a single-layered structure or a multi-layered structure. The material of metal material layer 112 may include a conductive metal material, such as Al, aluminum alloy (e.g., AlCu), Cu, copper alloy, Ti, Ta, W, or combinations thereof. In some embodiments, the material of metal material layer 112 may be AlCu. The metal material layer 112 may be formed by, for example, PVD, CVD, or ALD.

A barrier material layer 114 may be formed on the metal material layer 112. The material of the barrier material layer 114 may include Ta, TaN, Ti, TiN, or combinations thereof. The barrier material layer 114 may be formed by, for example, PVD or ALD. It should be noted that the barrier material layer 114 illustrated in FIG. 1E may be omitted in some alternative embodiments.

Figure 1F:
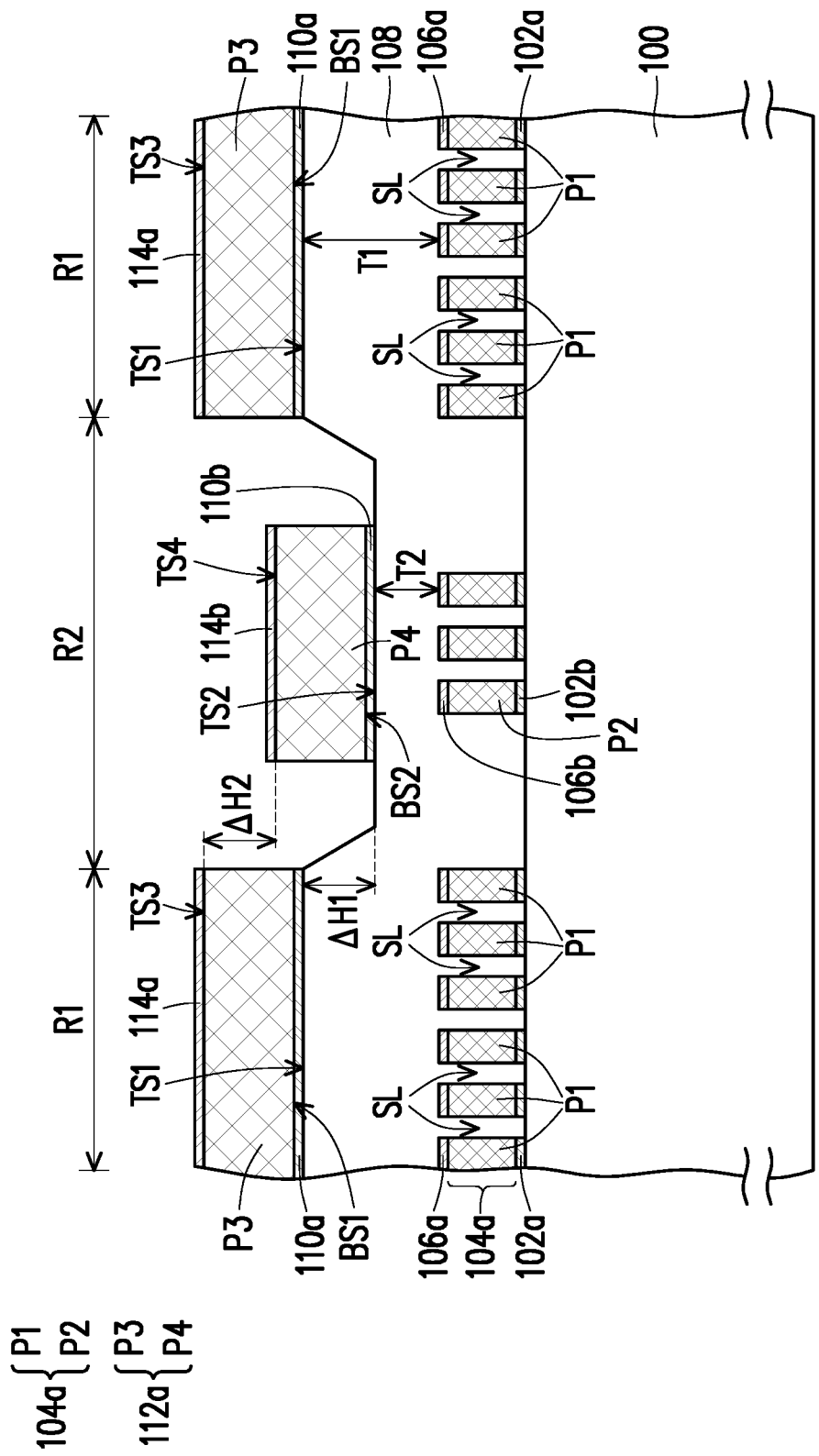

FIG. 1F is a cross-sectional view illustrating one stage of the method of fabricating the semiconductor device 10 in accordance with some embodiments of the disclosure. Referring to FIG. 1F, the barrier material layer 110, the metal material layer 112, and the barrier material layer 114 may be patterned to form a barrier layer 110a, a barrier layer 110b, a metal layer 112a, a barrier layer 114a, and a barrier layer 114b on the dielectric layer 108. For example, the barrier material layer 110, the metal material layer 112, and the barrier material layer 114 may be patterned by performing lithography process and etch process.

The metal layer 112a is disposed on the dielectric layer 108. In some embodiments, the metal layer 112a may be a mirror metal layer. The mirror metal layer can be used to reflect light. The metal layer 112a may include a metal pattern P3 and a metal pattern P4. The metal pattern P3 is located in the dense region R1. The metal pattern P4 is located in the isolation region R2. In some embodiments, the metal pattern P3 is located on the top surface TS1, and the metal pattern P4 is located on the top surface TS2. The metal pattern P3 and the metal pattern P4 may be separated from each other. The bottom surface BS1 of the metal pattern P3 may be higher than the bottom surface BS2 of the metal pattern P4. Moreover, the barrier layer 110a may be dispose between the metal pattern P3 and the dielectric layer 108. The barrier layer 110b may be dispose between the metal pattern P4 and the dielectric layer 108. The barrier layer 114a may be disposed on the metal pattern P3. The barrier layer 114b may be disposed on the metal pattern P4.

Moreover, since there is the slot SL in the metal pattern P1, the dielectric layer 108 can have better uniformity. Therefore, the maximum height difference ΔH2 between the top surface TS3 of the metal pattern P3 and the top surface TS4 of the metal pattern P4 can be reduced.

Figure 1G:
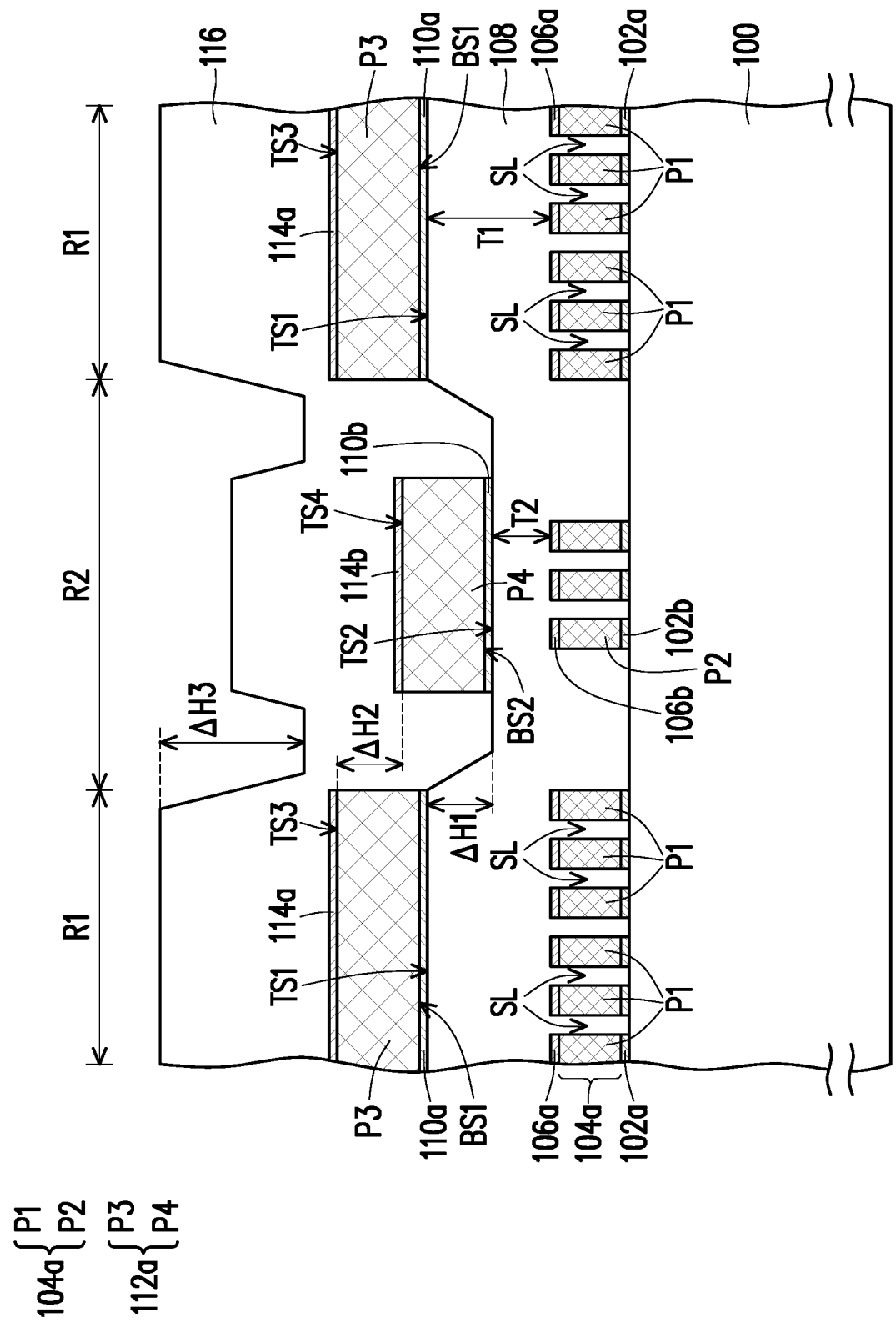

FIG. 1G is a cross-sectional view illustrating one stage of the method of fabricating the semiconductor device 10 in accordance with some embodiments of the disclosure. Referring to FIG. 1G, a passivation material layer 116 may be formed on the metal pattern P3 and the metal pattern P4. In some embodiments, the passivation material layer 116 may cover the barrier layer 110a, the barrier layer 110b, the metal layer 112a, the barrier layer 114a, and the barrier layer 114b. The passivation material layer 116 may have a maximum height difference ΔH3 between the dense region R1 and the isolation region R2. The material of passivation material layer 116 may include SiO, SiN, SiON, PSG, BPSG, SOG, FSG, carbon doped silicon oxide (e.g., SiCOH), polyimide, and/or combinations thereof. In some embodiments, the material of the passivation material layer 116 may be SiO. In some alternative embodiments, the material of the passivation material layer 116 may include low-k dielectric materials. It is understood that the material of the passivation material layer 116 may include one or more dielectric materials and/or one or more dielectric layers. In some embodiments, the passivation material layer 116 is formed to a suitable thickness by HDPCVD, FCVD, thermal CVD, SACVD, spin-on, sputtering, or other suitable methods.

Figure 1H:
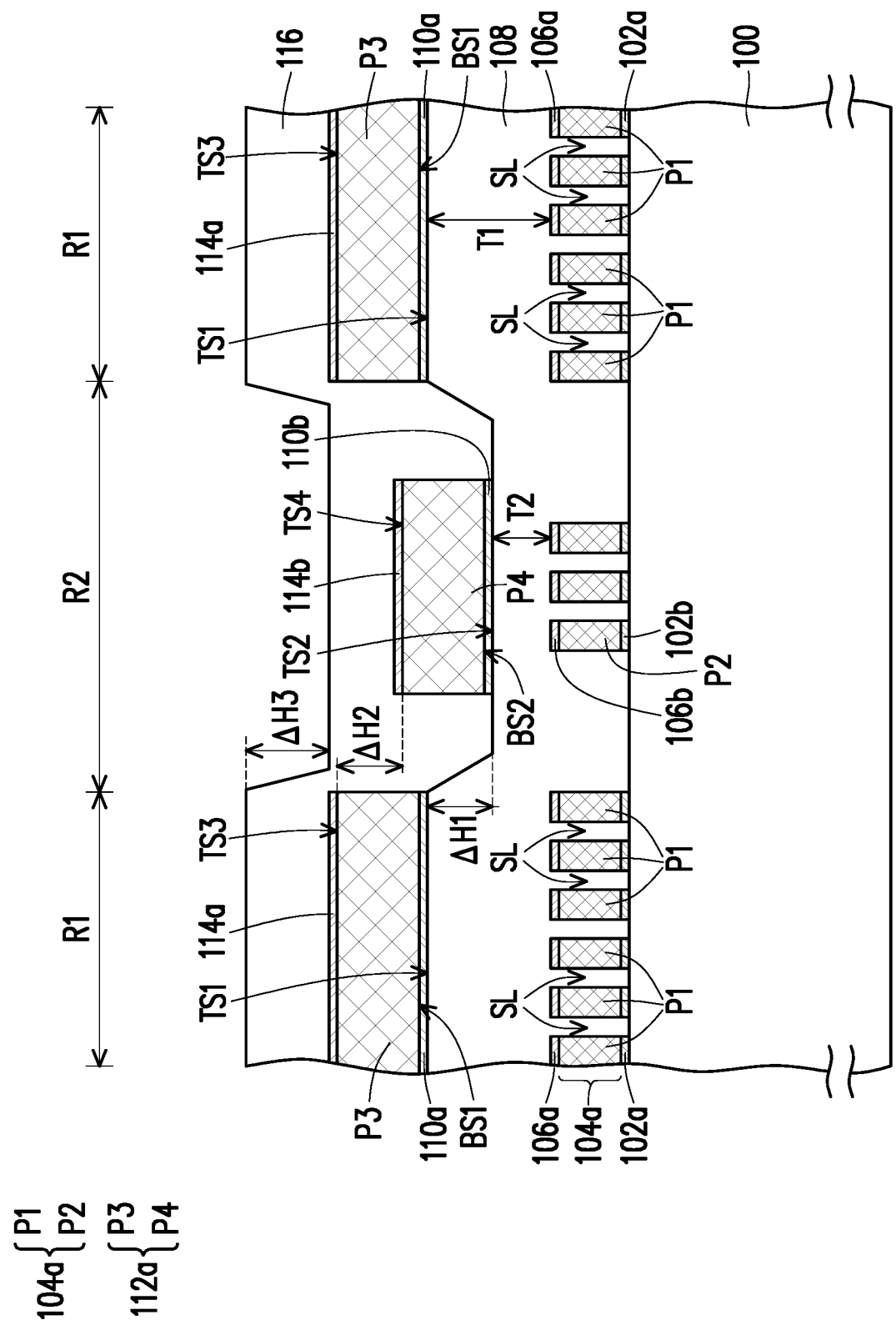

FIG. 1H is a cross-sectional view illustrating one stage of the method of fabricating the semiconductor device 10 in accordance with some embodiments of the disclosure. Referring to FIG. 1H, a CMP process may be performed on the passivation material layer 116. Thereby, the maximum height difference ΔH3 between the passivation material layer 116 in the dense region R1 and the passivation material layer 116 in the isolation region R2 can be reduced.

Figure 1I:
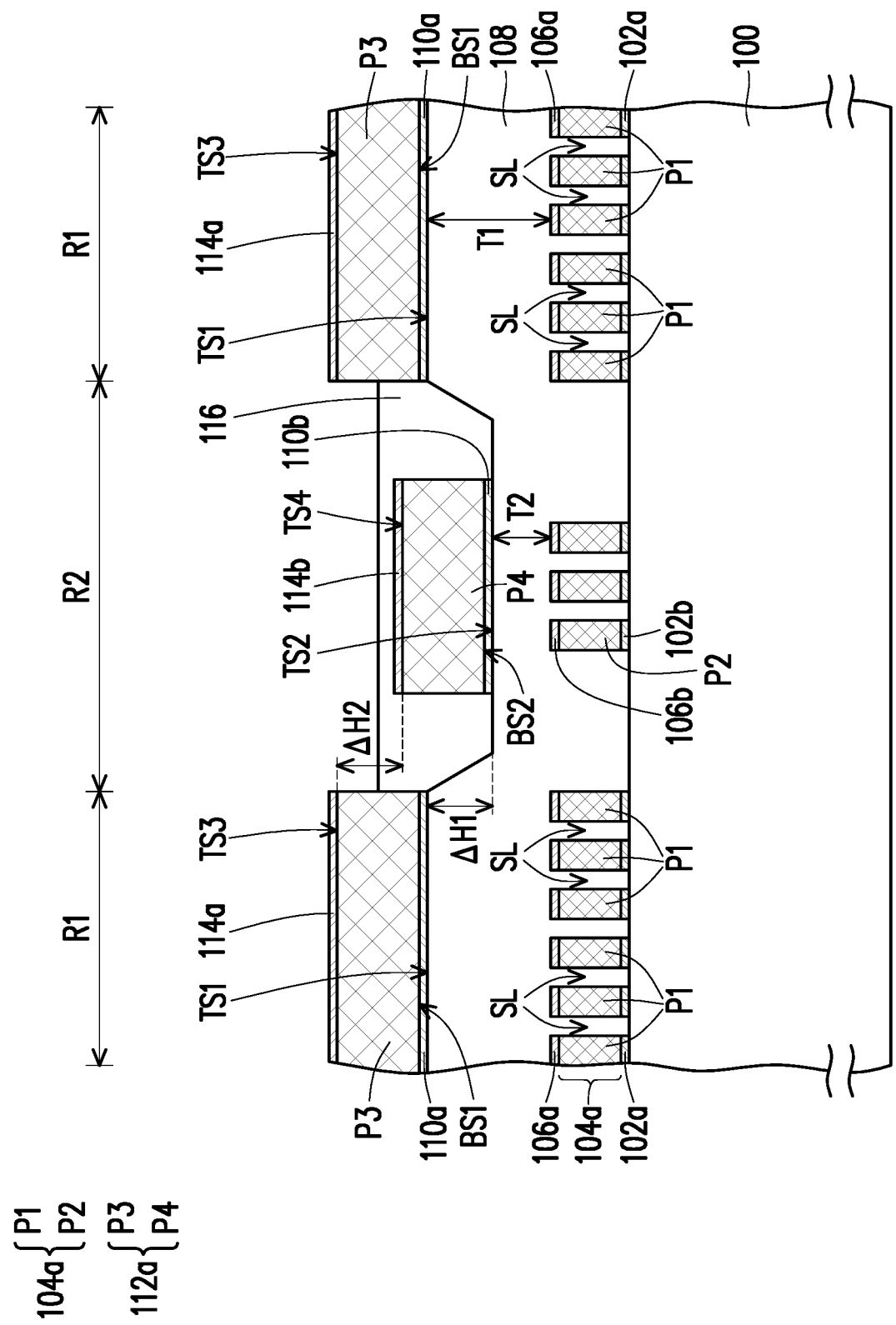

FIG. 1I is a cross-sectional view illustrating one stage of the method of fabricating the semiconductor device 10 in accordance with some embodiments of the disclosure. Referring to FIG. 1I, an etch back process may be performed on the passivation material layer 116 to expose the top surface of the barrier layer 114a. After the etch back process is performed, the passivation material layer 116 may remain on the top surface TS4 of the metal pattern P4. In some alternative embodiments, when the barrier layer 114a is omitted, the top surface TS3 of the metal pattern P3 may be exposed after the etch back process is performed on the passivation material layer 116. The etch back process may be a dry etch process.

Figure 1J:
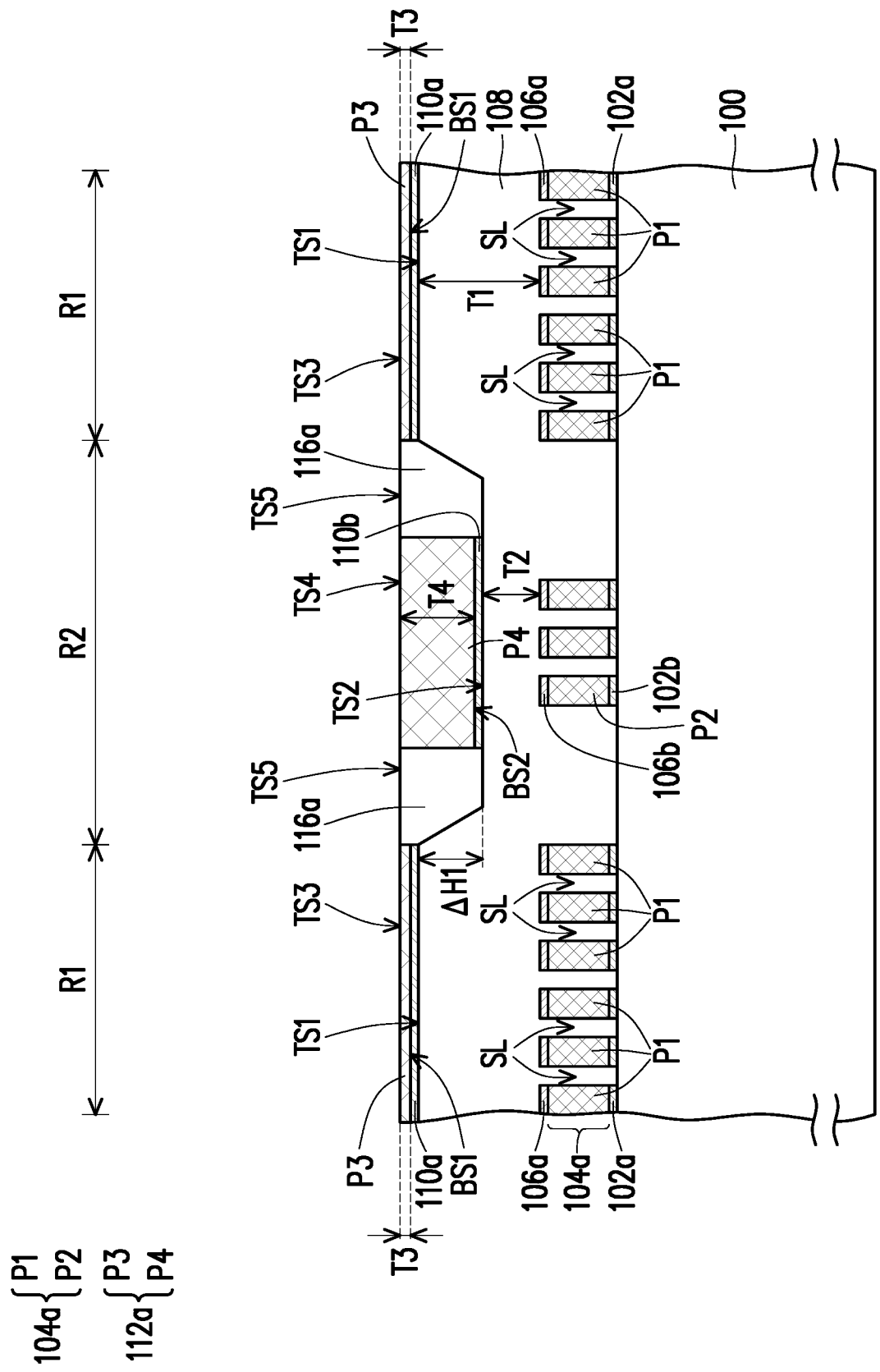

FIG. 1J is a cross-sectional view illustrating one stage of the method of fabricating the semiconductor device 10 in accordance with some embodiments of the disclosure. Referring to FIG. 1J, a CMP process may be performed on the barrier layer 114a, the metal pattern P3, the passivation material layer 116, and the barrier layer 114b to expose the top surface TS4 of the metal pattern P4 and to form a passivation layer 116a. In some embodiments, the CMP process may be further performed on the metal pattern P4, thereby removing a portion of the metal pattern P4. The passivation layer 116a may be disposed between the metal pattern P3 and the metal pattern P4. After the CMP process is performed, the barrier layer 114a and the barrier layer 114b may be removed. The thickness T3 of the metal pattern P3 may be less than the thickness T4 of the metal pattern P4. The top surface TS5 of the passivation layer 116a may be substantially flush with the top surface TS3 of the metal pattern P3 and the top surface TS4 of the metal pattern P4.

Moreover, due to the presence of the slot SL in the metal pattern P1, the dielectric layer 108 can have better uniformity, so that the maximum height difference ΔH2 between the top surface TS3 of the metal pattern P3 and the top surface TS4 of the metal pattern P4 can be reduced. Therefore, the passivation material layer 116 remaining on the top surface TS4 of the metal pattern P4 can be removed by the CMP process, so that the top surface TS4 of the metal pattern P4 is not covered by the passivation material layer 116, and the metal pattern P4 can have better reflectivity.

Figure 1K:
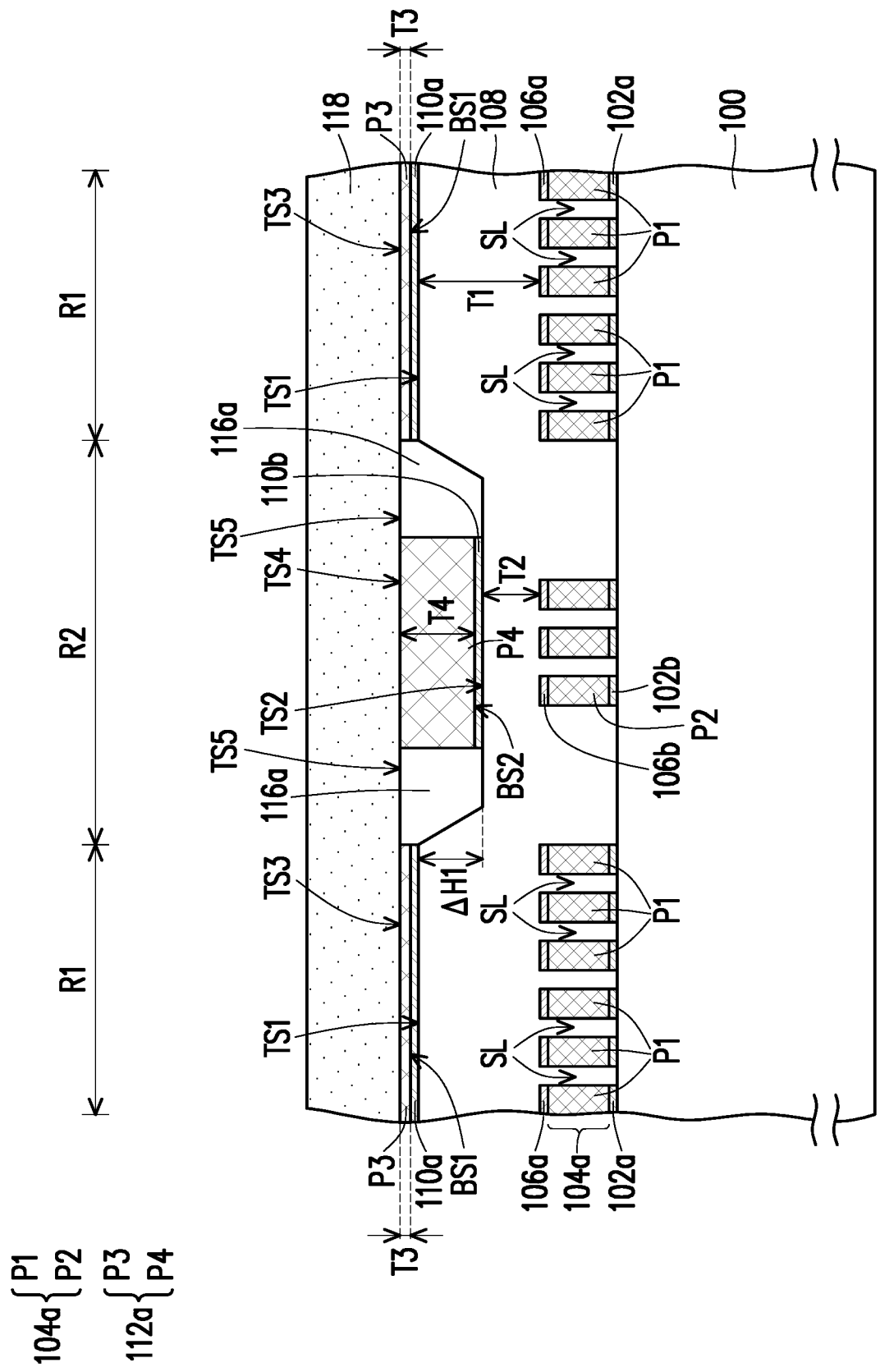

FIG. 1K is a cross-sectional view illustrating one stage of the method of fabricating the semiconductor device 10 in accordance with some embodiments of the disclosure. Referring to FIG. 1K, a dielectric layer 118 may be formed on the metal layer 112a and the passivation layer 116a. The material of dielectric layer 118 may include SiO, SiN, SiON, PSG, BPSG, SOG, FSG, carbon doped silicon oxide (e.g., SiCOH), polyimide, and/or combinations thereof. In some embodiments, the material of the dielectric layer 118 may be SiO. In some alternative embodiments, the material of the dielectric layer 118 may include low-k dielectric materials. It is understood that the material of the dielectric layer 118 may include one or more dielectric materials and/or one or more dielectric layers. In some embodiments, the dielectric layer 118 is formed to a suitable thickness by HDPCVD, FCVD, thermal CVD, SACVD, spin-on, sputtering, or other suitable methods.

In the semiconductor device 10, due to the presence of the slot SL in the metal pattern P1, the dielectric layer 108 can have better uniformity, so that no passivation material layer 116 remains on the top surface of the metal layer 112a in the subsequent process. Therefore, the top surface of the metal layer 112a is not covered by the passivation material layer 116, so that the metal layer 112a can have better reflectivity. Furthermore, the process of fabricating the semiconductor device 10 can be integrated with the current process without extra photomask and extra process.

Many variations of the above examples are contemplated by the present disclosure. It is understood that different embodiments may have different advantages, and that no particular advantage is necessarily required of all embodiments.

In accordance with some embodiments of the present disclosure, a semiconductor device includes a substrate, a first metal layer, a dielectric layer, and a second metal layer. The substrate includes a dense region and an isolation region. The first metal layer is disposed over the substrate and includes a first metal pattern and a second metal pattern. The first metal pattern is located in the dense region. There is at least one slot in the first metal pattern. The second metal pattern is located in the isolation region. The dielectric layer is disposed on the first metal layer. The second metal layer is disposed on the dielectric layer.

In accordance with alternative embodiments of the present disclosure, a semiconductor device includes a substrate, a first metal layer, a dielectric layer, and a second metal layer. The substrate includes a dense region and an isolation region. The first metal layer is disposed over the substrate and includes a first metal pattern and a second metal pattern. The first metal pattern is located in the dense region. There is at least one slot in the first metal pattern. The second metal pattern is located in the isolation region. The dielectric layer is disposed on the first metal layer. The dielectric layer has a first top surface in the dense region and a second top surface in the isolation region. The first top surface is higher than the second top surface. The second metal layer is disposed on the dielectric layer and includes a third metal pattern and a fourth metal pattern. The third metal pattern is located on the first top surface. The fourth metal pattern is located on the second top surface.

In accordance with alternative embodiments of the present disclosure, a method of fabricating a semiconductor device includes the following steps. A substrate is provided. The substrate includes a dense region and an isolation region. A first metal layer is formed over the substrate. The first metal layer includes a first metal pattern and a second metal pattern. The first metal pattern is located in the dense region. There is at least one slot in the first metal pattern. The second metal pattern is located in the isolation region. A dielectric layer is formed on the first metal layer. A second metal layer is formed on the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate comprising a dense region and an isolation region;
a first metal layer disposed over the substrate and comprising:
a plurality of first metal patterns located in the dense region, wherein the first metal patterns are separated from each other, and at least one of the first metal patterns includes at least one dielectric portion therein; and
a second metal pattern located in the isolation region;
a dielectric layer disposed on the first metal layer; and
a second metal layer disposed on the dielectric layer, comprising:
a third metal pattern located in the dense region; and
a fourth metal pattern located in the isolation region, wherein a thickness of the third metal pattern is less than a thickness of the fourth metal pattern.

2. The semiconductor device according to claim 1, wherein the at least one dielectric portion is integrally formed with the dielectric layer.

3. The semiconductor device according to claim 1, wherein the at least one dielectric portion penetrates through the at least one of the first metal patterns.

4. The semiconductor device according to claim 1, wherein the first metal patterns and the second metal pattern are separated from each other.

5. The semiconductor device according to claim 1, wherein the at least one of the first metal patterns comprises a first metal portion surrounding the at least one dielectric portion and the second metal pattern comprises a second metal portion, a ratio of a top view area of the first metal portion to a top view area of the dense region is greater than a ratio of a top view area of the second metal portion to a top view area of the isolation region.

6. The semiconductor device according to claim 1, wherein a thickness of the dielectric layer on the first metal patterns is greater than a thickness of the dielectric layer on the second metal pattern.

7. The semiconductor device according to claim 1, wherein a bottom surface of the third metal pattern is higher than a bottom surface of the fourth metal pattern.

8. The semiconductor device according to claim 1, further comprising:
a passivation layer disposed between the third metal pattern and the fourth metal pattern.

9. The semiconductor device according to claim 8, wherein a top surface of the passivation layer is substantially flush with a top surface of the third metal pattern and a top surface of the fourth metal pattern.

10. The semiconductor device according to claim 8, wherein the passivation layer has an inclined sidewall extending between a bottom surface of the third metal and a bottom surface of the fourth metal.

11. The semiconductor device according to claim 1, wherein a top surface of the third metal pattern is substantially flush with a top surface of the fourth metal pattern.

12. The semiconductor device according to claim 1, wherein the third metal pattern continuously extends over the first metal patterns.

13. A semiconductor device, comprising:
a substrate comprising a dense region and an isolation region;
a first metal layer disposed over the substrate and comprising:
a plurality of first metal patterns located in the dense region, wherein the first metal patterns are separated from each other; and
at least one second metal pattern located in the isolation region;
a dielectric layer disposed on the first metal layer, wherein the dielectric layer has a first top surface in the dense region and a second top surface in the isolation region, and the first top surface is higher than the second top surface, and a portion of the dielectric layer is disposed in at least one of the first metal patterns; and
a second metal layer disposed on the dielectric layer and comprising:
a third metal pattern located on the first top surface; and
a fourth metal pattern located on the second top surface, wherein a top surface of the third metal pattern is substantially flush with a top surface of the fourth metal pattern, and the second metal layer is in direct contact with the dielectric layer.

14. The semiconductor device according to claim 13, wherein the at least one second metal pattern comprises a plurality of second metal patterns, and the dielectric layer is continuously disposed in the at least one of the first metal patterns, disposed between the first metal patterns and disposed between the second metal patterns.

15. A method of fabricating a semiconductor device, comprising:
providing a substrate, wherein the substrate comprising a dense region and an isolation region;
forming a first metal layer over the substrate, wherein the first metal layer comprises:
a plurality of first metal patterns located in the dense region, wherein the first metal patterns are separated from each other, and at least one of the first metal patterns comprises at least one slot; and
a second metal pattern located in the isolation region;
forming a dielectric layer on the first metal layer, to fill the at least one slot, such that the at least one of the first metal patterns comprises at least one dielectric portion therein; and
forming a second metal layer on the dielectric layer, the second metal layer comprising:
a third metal pattern located in the dense region; and
a fourth metal pattern located in the isolation region, wherein a thickness of the third metal pattern is less than a thickness of the fourth metal pattern.

16. The method of fabricating the semiconductor device according to claim 15, wherein a method of forming the first metal layer comprises:
forming a first metal material layer over the substrate;
patterning the first metal material layer to form the first metal layer.

17. The method of fabricating the semiconductor device according to claim 15, further comprising:
performing a chemical mechanical polishing process on the dielectric layer.

18. The method of fabricating the semiconductor device according to claim 15, wherein the dielectric layer has a first top surface in the dense region and a second top surface in the isolation region, and the first top surface is higher than the second top surface,
the third metal pattern is located on the first top surface and
the fourth metal pattern is located on the second top surface.

19. The method of fabricating the semiconductor device according to claim 18, wherein a method of forming the second metal layer comprises:
forming a second metal material layer on the dielectric layer;
patterning the second metal material layer to form the second metal layer;
forming a passivation material layer on the third metal pattern and the fourth metal pattern;
performing a first chemical mechanical polishing process on the passivation material layer;
after performing the first chemical mechanical polishing process, performing an etch back process on the passivation material layer to expose a top surface of the third metal pattern, wherein after performing the etch back process, the passivation material layer remains on a top surface of the fourth metal pattern; and
after performing the etch back process, performing a second chemical mechanical polishing process on the third metal pattern and the passivation material layer to expose the top surface of the fourth metal pattern and to form a passivation layer, wherein the passivation layer is disposed between the third metal pattern and the fourth metal pattern.

20. The method of fabricating the semiconductor device according to claim 19, wherein the second chemical mechanical polishing process is further performed on the fourth metal pattern.

* * * * *